(12) United States Patent
Arima

(10) Patent No.: US 6,774,733 B2
(45) Date of Patent: Aug. 10, 2004

(54) FREQUENCY VARIABLE OSCILLATION CIRCUIT

(75) Inventor: Yutaka Arima, Iizuka (JP)

(73) Assignee: Exploitation of Next Generation Co., Ltd., Fukouka (JP)

(*) Notice: Subject to any disclaimer, the term of this patent is extended or adjusted under 35 U.S.C. 154(b) by 3 days.

(21) Appl. No.: 10/302,880

(22) Filed: Nov. 25, 2002

(65) Prior Publication Data

US 2003/0098748 A1 May 29, 2003

(30) Foreign Application Priority Data

Nov. 26, 2001 (JP) ....................................... 2001-402113

(51) Int. Cl.[7] ................................................. H03B 5/24
(52) U.S. Cl. .................. 331/57; 331/108 C; 331/177 R
(58) Field of Search ............................. 331/57, 108 C, 331/111, 177 R

(56) References Cited

U.S. PATENT DOCUMENTS 6,326,855 B1 * 12/2001 Jelinek et al. ................. 331/57

FOREIGN PATENT DOCUMENTS

WO    WO 02/059979 A1    8/2002

* cited by examiner

*Primary Examiner*—David Mis
(74) *Attorney, Agent, or Firm*—Finnegan, Henderson, Farabow, Garrett & Dunner, L.L.P.

(57) ABSTRACT

A-MOS devices capable of continuously modulating a gain coefficient β in accordance with a voltage applied to a control gate provided in addition to a normal gate, are connected in an odd number of stages to configure a ring oscillator. An oscillation circuit can be implemented capable of modulating an oscillation frequency in accordance with the control gate's voltage in a wide range.

6 Claims, 5 Drawing Sheets

FREQUENCY VARIABLE OSCILLATION CIRCUIT

BACKGROUND OF THE INVENTION

1. Field of the Invention

The present invention relates to oscillation circuits incorporated in large scale integrate circuits (LSIs) and contemplates devices capable of changing their oscillation frequency by voltage control over a wide range and continuously. Thus the present oscillation circuit can be utilized as LSI's reference clock oscillators, local oscillators for frequency modulation and demodulation, voltage-controlled oscillators (VCOs) for phase locked loop (PLL), and other similar, various types of oscillators, and as it allows an oscillation frequency to be dynamically and continuously controlled, it can contribute to enhanced performance of LSI.

2. Description of the Background Art

A circuit configuring an LSI generally requires a VCO in a PLL, a local oscillator in a radio frequency (RF) modulation and demodulation circuit, or other similar, various types of oscillation circuits. In an LSI, however, it is difficult to introduce large inductance (L) and large capacitance (C) in high integration. As such, it has been difficult to incorporate an LC oscillator of a wide range of frequency (intermediate and low frequencies in particular). Conventional LSIs requires that an element having large inductance, large capacitance or the like, a crystal oscillator, or the like be connected externally.

Furthermore, it has also been difficult to electrically, continuously modulate oscillation frequencies of conventional oscillation circuits. An oscillation frequency can be readily modulated by a divider if it is modulated discretely (digitally), i.e., in accordance with a power of 2. Continuous (analog) modulation required for example for VCOs, however, is difficult to obtain, since it requires that the oscillation circuit's resonance parameter or the like be modulated. Conventionally, an oscillation frequency is continuously modulated for example by using a varicap capable of modulating a capacitance with a voltage, or by controlling a current of a feedback circuit. Furthermore, another, proposed approach to electrically modulate an oscillation frequency is employing a backgate bias voltage of a ring oscillator to modulate a threshold value of a transistor. These approaches, however, suffer small frequency modulation ranges.

FIG. 3 shows a basic circuit configuration of a ring oscillator. The ring oscillator is characterized in that inverters 100 in an odd number of stages (a logic inversion circuit) connected in series form a delay circuit 105 outputting a signal which is connected to an input of delay circuit 105 to form a feedback loop of a delay signal. It is referred to as a ring oscillator because the odd number of inverters 100 are connected in a ring. One of outputs of the inverters is provided as an output of the ring oscillator via a buffer 101. Each inverter 100 is typically configured by a CMOS (Complementary Metal Oxide Semiconductor) inverter circuit shown in FIG. 4. A ring oscillator has its oscillation frequency determined by its inverter's driving ability and load capacitance and the number of the inverters connected in stages. If each inverter delays a signal by a time Td, then an oscillation frequency f is:

$$f=1/(2\Sigma Td) \approx 1/(2n^*Td) \quad (1),$$

wherein $\Sigma$ represents the sum with respect to all of the inverters connected in the ring and n represents the number of the stages of the inverter ring. As such, for a ring oscillator, oscillation frequency f can be set by adjusting an MOS transistor's gate width to gate length ratio to change delay time Td at each inverter or by changing number n of inverters connected in stages. In other words, for the conventional ring oscillator shown in FIGS. 3 and 4, if power supply voltage is not changed, an oscillation frequency cannot be changed as long as the layout (the geometry of hardware) is not changed.

An exemplary configuration of a frequency variable ring oscillator oscillation circuit will now be described. FIG. 5 exemplarily shows a configuration of a circuit of a ring oscillator capable of modulating an oscillation frequency with a voltage. The FIG. 3 example is distinguished from the FIG. 5 conventional example only in that an MOS transistor's backgate voltage (or well potential) is not connected to a power supply voltage GND or Vd but to a control terminal receiving a voltage Vwn or Vwp independent of the power supply voltage. The MOS transistor can have a threshold value modulated by its backgate voltage. As such, by changing voltages Vwn and Vwp providing each backgate voltage, the MOS transistor's threshold value can be changed, the transistor's drive current can be modulated, and each inverter's delay time Td can be changed. Consequently, oscillation frequency f represented by expression (1) can be modulated.

In the FIG. 5 configuration, as a backgate voltage varies, frequency modulation characteristics are obtained, as shown in FIG. 6. In FIG. 6, $\Delta$Vw represents an amount of modulation of voltage Vwn and Vwp, and Vwn=Vd+$\Delta$Vw and Vwp=GND$-\Delta$Vw for the sake of illustration. Furthermore, $\Delta$f indicates a ratio of a frequency after modulation to that before modulation (i.e., $\Delta$Vw=0). In this exemplary, prior art configuration, despite a backgate voltage's modulation amplitude has been changed to correspond to a power supply voltage's amplitude, a frequency modulation of approximately 30% is only achieved. This is attributed to the fact that the transistor has a threshold value in proportion to a square root of the backgate voltage. It is apparent that in this exemplary, prior art circuit configuration, there is a limit in modulating an oscillation frequency over a wide range.

SUMMARY OF THE INVENTION

The present invention provides an oscillation circuit including a plurality of inverters configuring a ring oscillator, at least one of the plurality of inverters being configured of an MOS transistor capable of modulating a gain coefficient electrically in analog manner.

The present invention in another configuration provides an oscillation circuit including N inverters connected in series to configure a ring oscillator, N being an odd integer of no less than three, at least one of the N inverters including an MOS transistor capable of modulating a gain coefficient electrically in analog manner.

Preferably the N inverters each include an MOS transistor of a first conductivity having a first control gate receiving a first voltage to allow the gain coefficient to continuously vary in accordance with the first voltage, and an MOS transistor of a second conductivity opposite to the first conductivity, having a second control gate receiving a second voltage to allow the gain coefficient to continuously vary in accordance with the second voltage.

More preferably the N inverters are each driven by first and second power supply voltages distinguished from the first and second voltages and the MOS transistors of the first and second conductivities receive one and the other of backgate voltages, respectively, set to be the first and second power supply voltages, respectively.

Alternatively, more preferably, each MOS transistor of the first conductivity has a source, a drain and a normal MOS gate and in addition the first control gate for controlling a direction of an electric field in a channel region, and each MOS transistor of the second conductivity has a source, a drain and a normal MOS gate and in addition the second control gate for controlling a direction of an electric field in a channel region.

Alternatively, more preferably, the oscillation circuit further includes a buffer for outputting a signal output from one of the N inverters.

Therefore a main advantage of the present invention is that an MOS transistor capable of continuously modulating a gain coefficient $\beta$ can be used to configure a ring oscillator to implement an oscillation circuit having a capability of a wide frequency modulation. As such, when the present oscillation circuit is used as a source of a reference clock of an LSI, the LSI's operating frequency can dynamically be adjusted to allow fine control of low power consumption.

Furthermore, it can also be used in a variety of fields as an LSI incorporated circuit represented for example by VCOs for PLL and local oscillation circuits for RF signal modulation and demodulation circuits as it has a simple circuit configuration and a compact circuit size.

The foregoing and other objects, features, aspects and advantages of the present invention will become more apparent from the following detailed description of the present invention when taken in conjunction with the accompanying drawings.

DESCRIPTION OF THE PREFERRED
EMBODIMENTS

Figure 1:
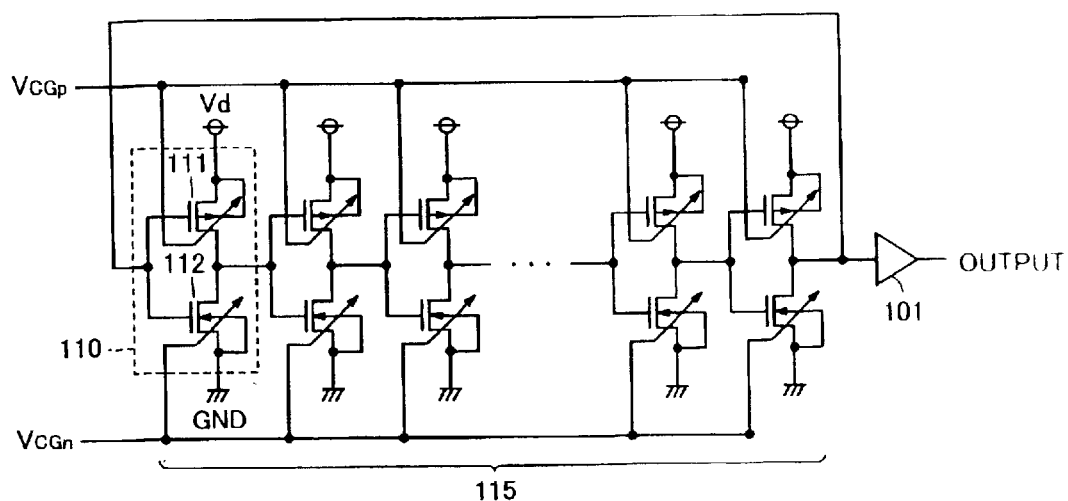
FIG. 1 shows an example of a circuit of a configuration of a ring oscillator of the present invention.

With reference to FIG. 1, the present invention provides an oscillation circuit including a delay circuit 115 having an odd number of inverters 110, and an output buffer 101. The present oscillation circuit is distinguished from the FIG. 5 ring oscillator in that delay circuit 105 including typical CMOS inverters 100 in an odd number of stages is replaced by delay circuit 115 including inverters 110 in an odd number of stages that are each configured of an adjustable $\beta$-MOS (A-MOS) devices 111 and 112.

The A-MOS device is configured and has characteristics, as will simply be described hereinafter. Note that the A-MOS device is specifically disclosed in pamphlet of International Publication No. WO02/059979A1.

Figure 7:
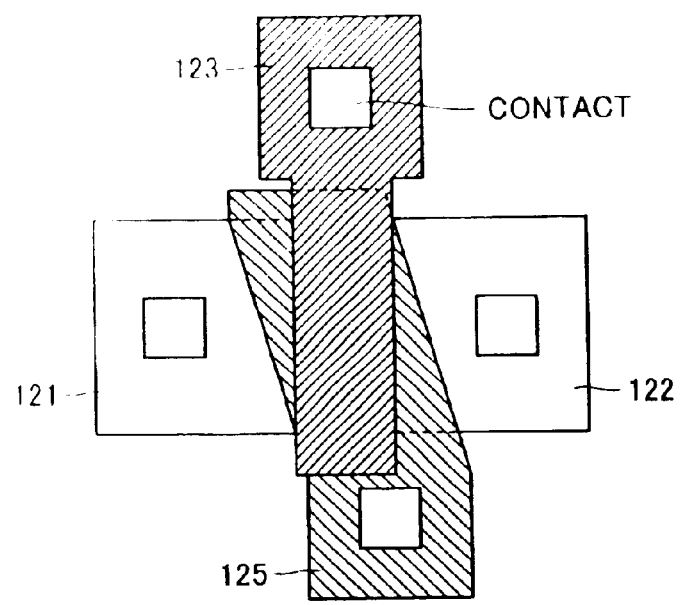
FIG. 7 shows a configuration of an A-MOS device used in the present invention.

With reference to FIG. 7, the A-MOS device has a source 121, a drain 122 and a gate 123 (hereinafter also referred to as a "normal MOS gate"), similarly as a typical MOS transistor does, and in addition thereto the A-MOS device further has a control gate 125. Source 121, drain 122, normal MOS gate 123 and control gate 125 are each provided with a contact, as appropriate. In the A-MOS device, a gain coefficient $\beta$ is modulated in analog manner in accordance with a voltage applied to control gate 125.

Figure 8:
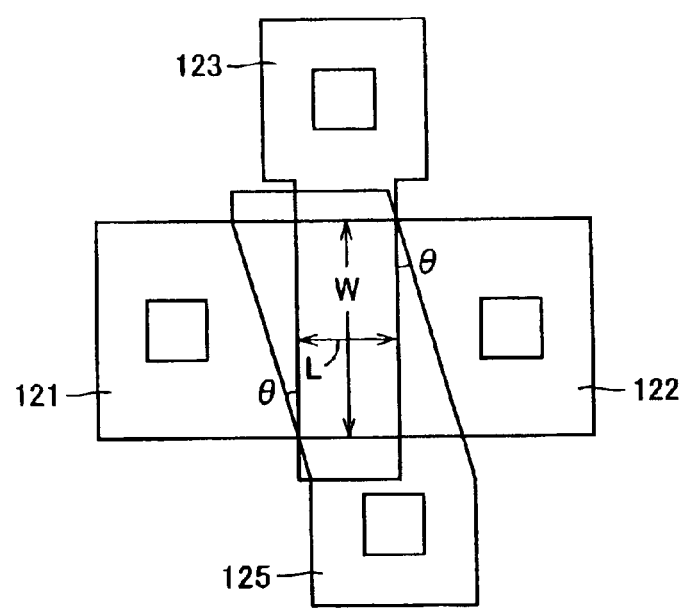
FIG. 8 shows a parameter of the configuration of the A-MOS device used in the present invention.

In the A-MOS device, gain coefficient $\beta$ modulation characteristics are determined by device geometry parameters indicated in FIG. 8, more specifically, a gate length L and width W of normal MOS gate 123 and an angle $\theta$ formed by normal MOS gate 123 and control gate 125. In other words, by designing these parameters, a ratio between a minimal $\beta$ and a maximum $\beta$ can be set relatively freely.

Figure 9A:
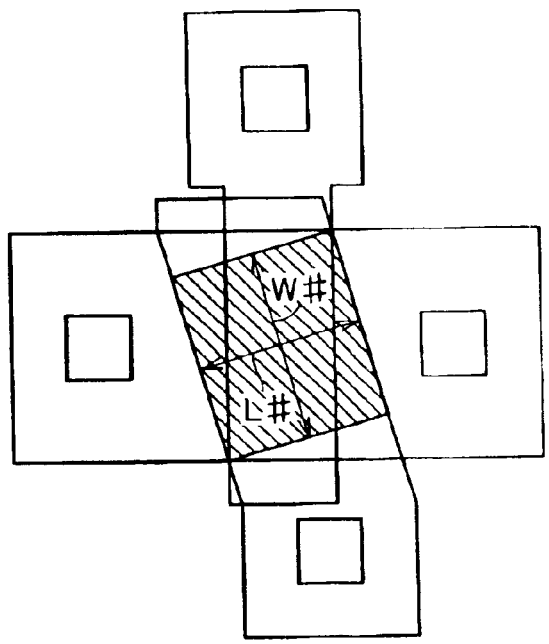
FIGS. 9A and 9B represent a $\beta$ modulation parameter of the A-MOS device used in the present invention.
Figure 9B:
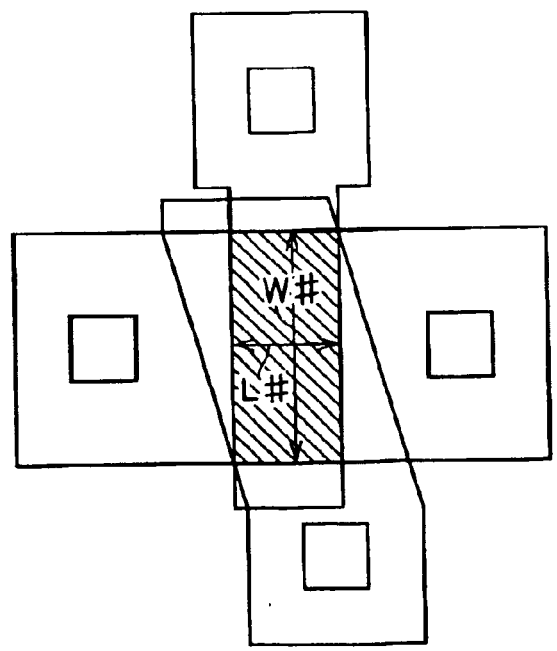

FIGS. 9A and 9B show a principle of $\beta$ modulation in the A-MOS device. FIG. 9A shows that a conductance of a channel of control gate 125 is set to be equivalent to that of normal MOS gate 123. In the figure, the hatched portion indicates an effective gate region.

By contrast, FIG. 9B shows that the conductance of the channel of control gate 125 is set to be sufficiently larger than that of normal MOS gate 123, with the hatched portion indicating an effective gate region.

Thus in the A-MOS device a control gate voltage applied to control gate 125 can be changed to control a direction of an electric field in a channel region to modulate effective gate length L# and width W# in analog manner. Consequently in accordance with the control gate voltage the gain coefficient $\beta$ can be modulated in analog manner. More specifically in the A-MOS device there is provided a configuration capable of relatively compactly implementing $\beta$ modulation characteristics approximately 10 to 1,000 times. As such, using the A-MOS device to configure an inverter of a ring oscillator allows the inverter to have a driving ability modulated in accordance with the control gate voltage over a wide range to implement an oscillation circuit having an ability to modulate a frequency over a wide range.

Referring again to FIG. 1, p-channel A-MOS device 111 has its control gate receiving a voltage $V_{CGp}$ input to a control voltage terminal and n-channel A-MOS device 112 has its control gate receiving a voltage $V_{CGn}$ input to a control voltage terminal. Voltages $V_{CGp}$ and $V_{CGn}$ are different from power supply voltages Vd and GND. By changing voltages $V_{CGp}$ and $V_{CGn}$, each inverter 110 can vary in driving ability. This can eliminate the necessity of changing the number of inverters connected in stages or any other similar hardware to help to modulate an oscillation frequency of an oscillation circuit (or ring oscillator).

Figure 5:
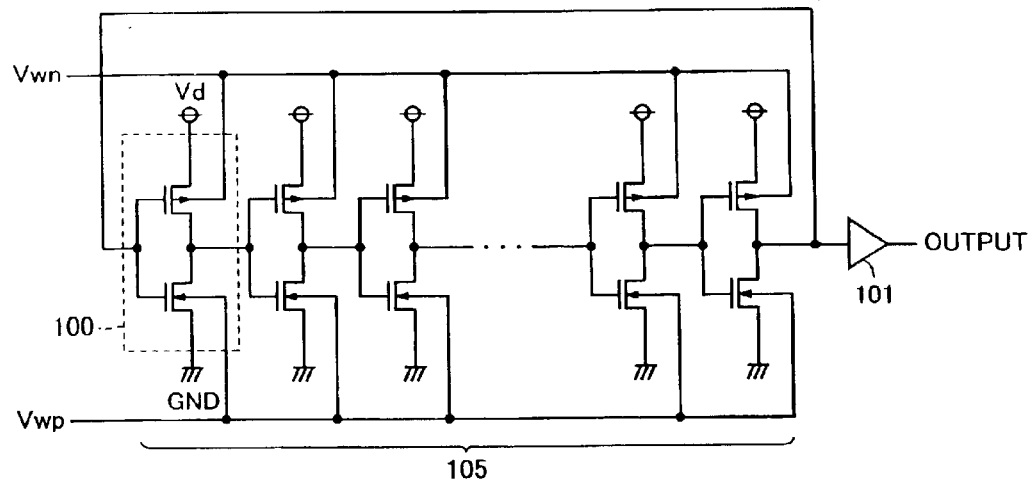
FIG. 5 shows a configuration of a circuit of a prior art ring oscillator with an oscillation frequency variably modulated.

Note that the remainder of the present oscillation circuit has a configuration similar to that of the FIG. 5 ring oscillator. Accordingly, it will not be described in detail.

Figure 2:
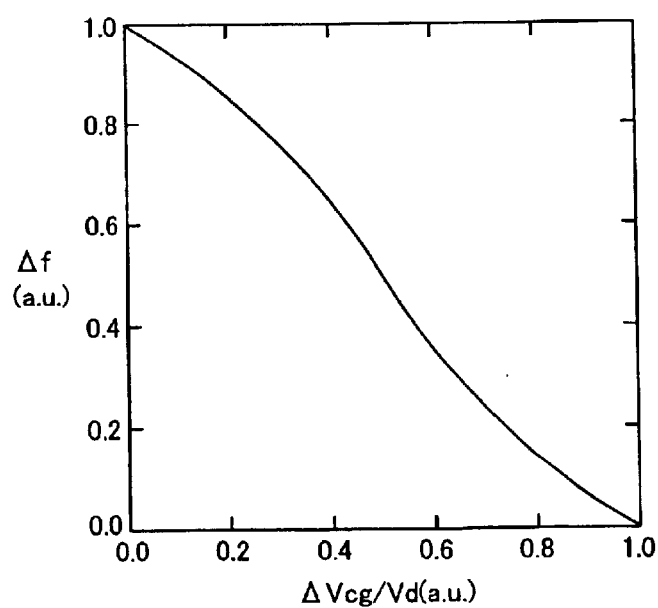
FIG. 2 represents the present ring oscillator's frequency modulation characteristics.
Figure 3:
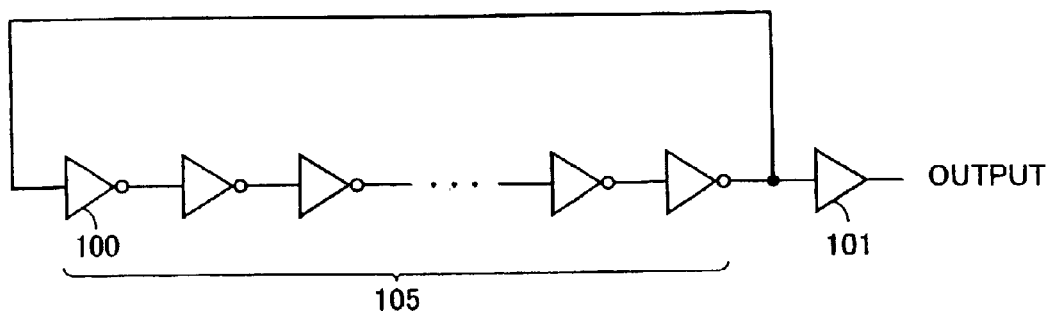
FIG. 3 is a diagram of a circuit of a configuration of a conventional ring oscillator.
Figure 4:
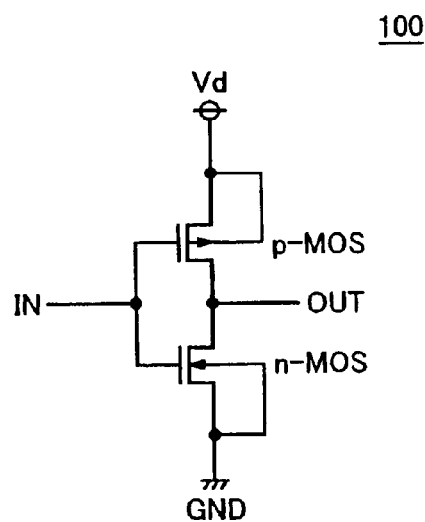
FIG. 4 shows an example of a configuration of a conventional inverter circuit.

FIG. 2 represents frequency modulation characteristics in the FIG. 1 oscillation circuit.

Figure 6:
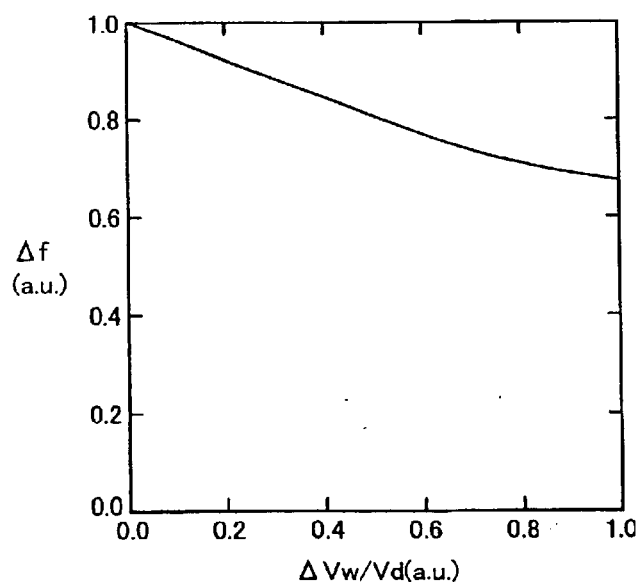
FIG. 6 represents the prior art ring oscillator's frequency modulation characteristics.

In the figure, the horizontal axis represents an amount of modulation of control gate voltage VCG, which is represented by $V_{CG}=Vd+\Delta V_{CG}$. Herein, control gate voltage $V_{CG}$ generally indicates voltage $V_{CGp}$, $V_{CGn}$ applied to the control gate, as has been described above. The vertical axis $\Delta f$ represents a ratio of a frequency after modulation to that before modulation (i.e., $\Delta V_{CG}=0$), similarly as shown in FIG. 6.

The A-MOS device's wide and continuous β modulation characteristics allow a ring oscillator (or an oscillation circuit)'s oscillation characteristics to be modulated over a wide range and continuously. In particular, since the A-MOS device's β modulation characteristics are substantially linear, a frequency can be modulated over a range no less than three times frequency modulation characteristics of a conventional ring oscillator with an oscillation frequency variably modulated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An oscillation circuit comprising a plurality of inverters configuring a ring oscillator, at least one of said plurality of inverters being configured of an MOS transistor capable of modulating a gain coefficient electrically in analog manner.

2. An oscillation circuit comprising N inverters connected in series to configure a ring oscillator, N being an odd integer of no less than three, at least one of said N inverters including an MOS transistor capable of modulating a gain coefficient electrically in analog manner.

3. The oscillation circuit of claim 2, wherein said N inverters each include:

an MOS transistor of a first conductivity having a first control gate receiving a first voltage to allow said gain coefficient to continuously vary in accordance with said first voltage; and an MOS transistor of a second conductivity opposite to said first conductivity, having a second control gate receiving a second voltage to allow said gain coefficient to continuously vary in accordance with said second voltage.

4. The oscillation circuit of claim 3, wherein:

said N inverters are each driven by first and second power supply voltages distinguished from said first and second voltages; and said MOS transistors of said first and second conductivities receive one and the other of backgate voltages, respectively, set to be said first and second power supply voltages, respectively.

5. The oscillation circuit of claim 3, wherein:

said MOS transistor of said first conductivity has a source, a drain and a normal MOS gate and in addition said first control gate for controlling a direction of an electric field in a channel region; and said MOS transistor of said second conductivity has a source, a drain and a normal MOS gate and in addition said second control gate for controlling a direction of an electric field in a channel region.

6. The oscillation circuit of claim 2, further comprising a buffer for outputting a signal output from one of said N inverters.

* * * * *

UNITED STATES PATENT AND TRADEMARK OFFICE
CERTIFICATE OF CORRECTION

PATENT NO.        : 6,774,733 B2                                              Page 1 of 1
APPLICATION NO.   : 10/302880
DATED             : August 10, 2004
INVENTOR(S)       : Yutaka Arima It is certified that error appears in the above-identified patent and that said Letters Patent is hereby corrected as shown below:

On the title page, item (73), in the Assignee, line 2, "Fukouka" should read --Fukuoka--.

Signed and Sealed this

Eighth Day of July, 2008

JON W. DUDAS
*Director of the United States Patent and Trademark Office*